United States Patent
Chang et al.

(10) Patent No.: US 9,147,694 B2
(45) Date of Patent: Sep. 29, 2015

(54) DENSITY GRADIENT CELL ARRAY

(71) Applicant: Taiwan Semiconductor Manufacturing Company Limited, Hsin-Chu (TW)

(72) Inventors: Yu-Jung Chang, Zhubei (TW); C. R. Hsu, Hsinchu (TW); Chin-Chang Hsu, Banqiao (TW); Wen-Ju Yang, Hsinchu (TW); Chung-min Fu, Chungli (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 362 days.

(21) Appl. No.: 13/721,552

(22) Filed: Dec. 20, 2012

(65) Prior Publication Data
US 2014/0151751 A1    Jun. 5, 2014

Related U.S. Application Data

(60) Provisional application No. 61/732,242, filed on Nov. 30, 2012.

(51) Int. Cl.
*G06F 17/50* (2006.01)
*H01L 27/118* (2006.01)
*H01L 27/02* (2006.01)

(52) U.S. Cl.
CPC ...... *H01L 27/11803* (2013.01); *G06F 17/5072* (2013.01); *H01L 27/0207* (2013.01)

(58) Field of Classification Search
None
See application file for complete search history.

(56) References Cited

U.S. PATENT DOCUMENTS

| | | | | |
|---|---|---|---|---|
| 6,020,616 A * | 2/2000 | Bothra et al. | | 257/381 |
| 7,137,092 B2 * | 11/2006 | Maeda | | 716/53 |
| 7,543,262 B2 * | 6/2009 | Wang et al. | | 716/119 |
| 7,681,166 B2 * | 3/2010 | van Adrichem et al. | | 716/119 |
| 7,737,472 B2 * | 6/2010 | Kondo et al. | | 257/206 |
| 7,771,901 B2 * | 8/2010 | Lee et al. | | 430/5 |
| 7,862,962 B2 * | 1/2011 | Shieh et al. | | 430/5 |
| 7,934,173 B2 * | 4/2011 | Shyu et al. | | 716/50 |
| 2008/0121939 A1 * | 5/2008 | Murray et al. | | 257/202 |

* cited by examiner

*Primary Examiner* — Leigh Garbowski
(74) *Attorney, Agent, or Firm* — Cooper Legal Group, LLC (57) ABSTRACT

One or more techniques or systems for mitigating density gradients between two or more regions of cells are provided herein. In some embodiments, an array of cells is associated with a dummy region. For example, the array of cells includes an array of gates and an array of OD regions. In some embodiments, the array of gates includes a first set of gates associated with a first gate dimension and a second set of gates associated with a second gate dimension. In some embodiments, the array of OD regions includes a first set of OD regions associated with a first OD dimension and a second set of OD regions associated with a second OD dimension. In this manner, at least one of a pattern density, gate density, or OD density is customized to a region associated with active cells, thus mitigating density gradients between respective regions.

20 Claims, 10 Drawing Sheets

DENSITY GRADIENT CELL ARRAY

RELATED APPLICATION(S)

This application claims the benefit of U.S. Patent Application No. 61/732,242, filed on Nov. 30, 2012, entitled "Density Gradient Cell Array", at least some of which is incorporated herein.

BACKGROUND

Generally, semiconductors are associated with an array of cells. For example, the array of cells is associated with a region. For another example, the semiconductor comprises active cells and surrounding patterns. Generally, the surrounding patterns surround at least some of the active cells.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for mitigating a density gradient between regions are provided herein. For example, a first region of cells is adjacent to a second region of cells. In some embodiments, the first region of cells is associated with at least one of a first pattern density, a first gate density, or a first OD density. Similarly, the second region of cells is associated with at least one of a second pattern density, a second gate density, or a second OD density. In some embodiments, at least one of the second pattern density, the second gate density, or the second OD density is adjusted based on at least one of the first pattern density, the first gate density, or the first OD density.

Accordingly, in some embodiments, an array of cells comprises an array of gates and an array of OD regions. In some embodiments, the array of cells is associated with a second region. For example, the array of gates comprises a first set of gates associated with a first gate dimension and a second set of gates associated with a second gate dimension. Similarly, the array of OD regions comprises a first set of OD regions associated with a first OD dimension and a second set of OD regions associated with a second OD dimension. In some embodiments, an array of cells is laid out within a second region. For example, the array comprises a first set of gates associated with a first gate dimension and a first set of OD regions associated with a first OD dimension. In some embodiments, at least one of a first subset of gates associated with the first gate dimension or a first subset of OD regions associated with the first OD dimension is inserted. In some embodiments, at least one of a second set of gates associated with a second gate dimension or a second set of OD regions associated with a second OD dimension is inserted. In this way, large density gradients are mitigated between the first region and the second region, at least because respective first sets and second sets are adjusted based on the densities associated with the first region.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

It will be appreciated that for at least some of the figures herein, one or more boundaries are drawn with different heights, widths, perimeters, aspect ratios, etc. relative to one another merely for illustrative purposes, and are not necessarily drawn to scale. Accordingly, dimensions of some of these boundaries are drawn taller, shorter, wider, narrower, etc. than needed in some embodiments so that the different boundaries are visible in the figures, for example.

Figure 1:
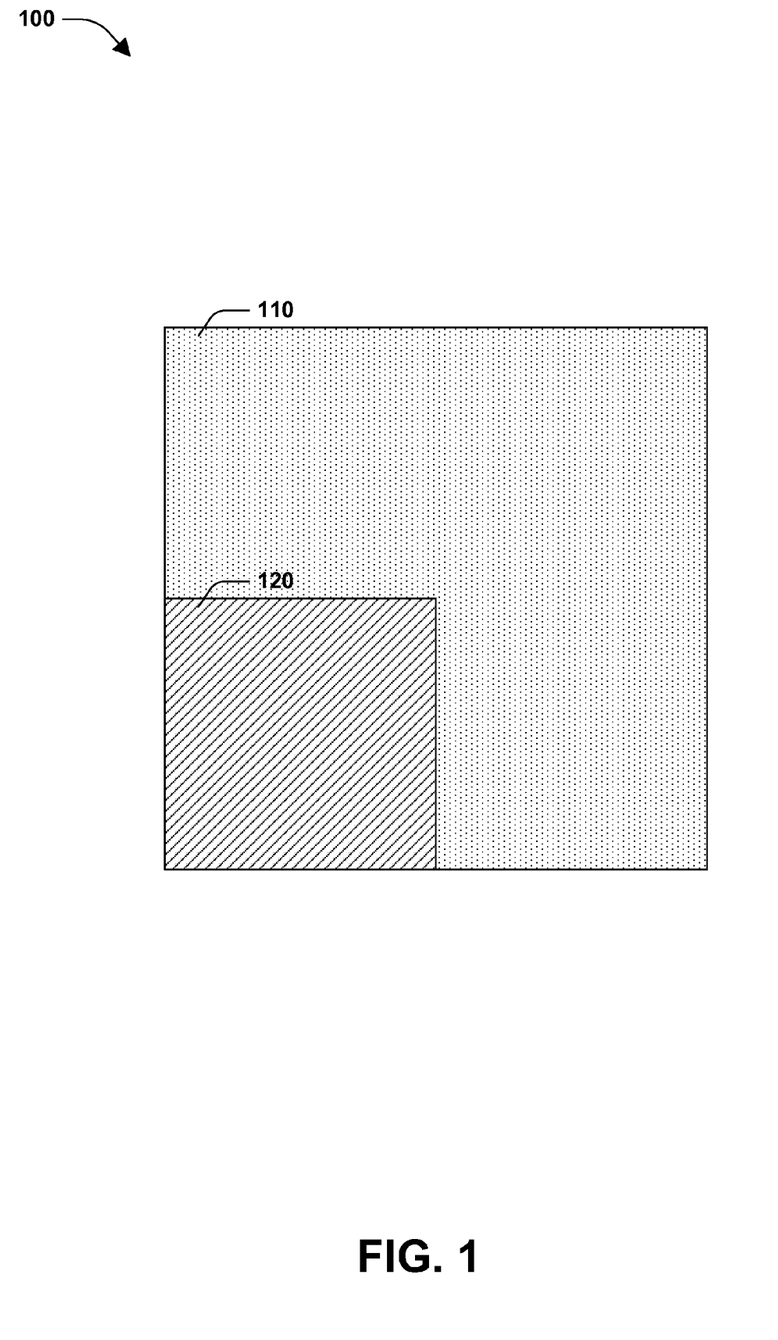
FIG. 1 is a layout view of an example array of cells for mitigating density gradients between regions, according to some embodiments.

FIG. 1 is a layout view 100 of an example array of cells for mitigating density gradients between regions, according to some embodiments. In some embodiments, a first region 120 is adjacent to a second region 110. In some embodiments, the first region 120 comprises an array of cells. Similarly, the second region 110 comprises an array of cells. In some embodiments, the first region is associated with active cells and is an active region. In some embodiments, the second region 110 is associated with dummy cells and is a dummy region. In some embodiments, the first region 120 is associated with at least one of a first pattern density, a first gate density, or a first OD density. In some embodiments, the second region 110 is associated with at least one of a second pattern density, a second gate density, or a second OD density. In some embodiments, at least one of the second pattern density, the second gate density, or the second OD density is substantially equal to at least one of the first pattern density, the first gate density, or the first OD density. In some embodiments, a density gradient between at least one of the second pattern density and the first pattern density, the second gate density and the first gate density, or the second OD density and the first OD density is less than ten percent. In some embodiments, a second pattern density for the array of cells is adjusted based on a first pattern density of a first region. In some embodiments, a second gate density for the array of cells is adjusted based on a first gate density of a first region. In some embodiments, a second OD density for the array of cells is adjusted based on a first OD density of a first region.

Figure 2:
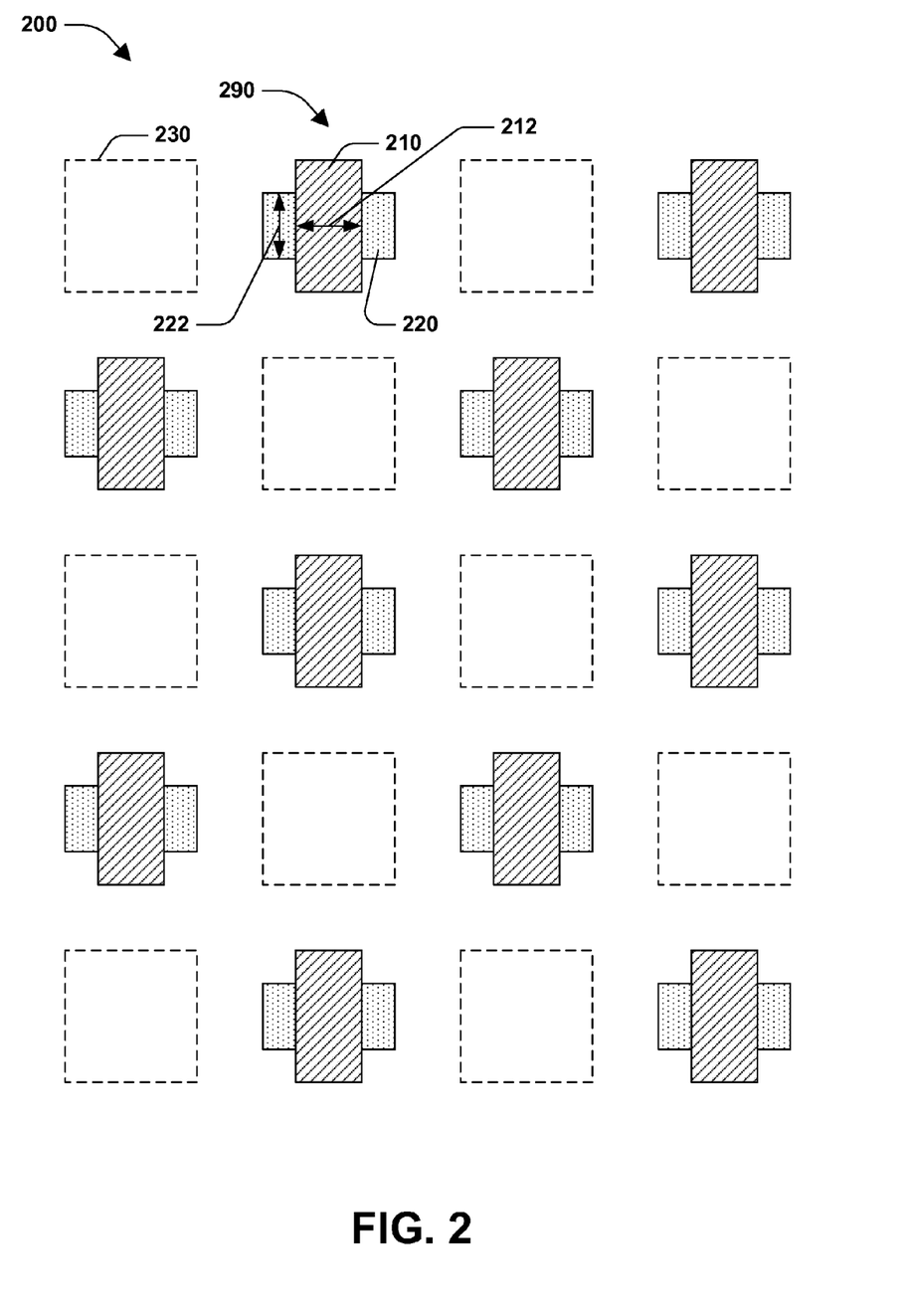
FIG. 2 is a layout view of an example array of cells for mitigating density gradients between regions, according to some embodiments.

FIG. 2 is a layout view 200 of an example array of cells for mitigating density gradients between regions, according to some embodiments. In some embodiments, an array of cells is laid out. For example, the array of cells is associated with a second region. In some embodiments, the second region is adjacent to a first region. Additionally, the first region is associated with at least one of a first pattern density, a first gate density, or a first OD density. Similarly, the second region is associated with at least one of a second pattern density, a second gate density, or a second OD density. In some embodiments, the array of cells comprises one or more empty spaces 230, a first set of gates 210 associated with a first gate dimension 212, and a first set of OD regions 220 associated with a first OD dimension 222. In some embodiments, a gate 210 coupled to an OD region 220 forms a cell of the array of cells, such as cell 290, for example. In some embodiments, a first set of cells is associated with the first set of gates 210 and the first set of OD regions 220. In some embodiments, at least some of at least one of the empty spaces 230 or the first set of cells is formed in a checkerboard pattern. In some embodiments, at least one of the second pattern density, the second gate density, or the second OD density of the cell array of FIG. 2 is associated with a density gradient greater than ten percent with regard to the first pattern density, the first gate density, or the first OD density, respectively. Accordingly, respective densities for the cell array associated with the second region are adjusted, as will be described in FIG. 3.

In some embodiments, the first gate dimension 212 is associated with a design maximum gate dimension. In some embodiments, the first OD dimension 222 associated with a design maximum OD dimension. In some embodiments, the first gate dimension 212 is associated with a gate dimension of a cell within another region, such as a cell of a first adjacent region, for example. In some embodiments, the first OD dimension 222 is associated with an OD dimension of a cell within another region, such as a cell of the first adjacent region, for example. In some embodiments, the first gate dimension 212 is based on a first gate density of a first region. For example, a larger first gate dimension 212 is used based on a higher first gate density for the first region. In some embodiments, the first OD dimension 222 is based on a first OD density of a first region. For example, a larger first OD dimension 222 is used based on a higher first OD density for the first region. In some embodiments, the first gate dimension 212 is set based on a gate dimension of a cell within another region, such as a first region. In some embodiments, the first OD dimension 222 is set based on an OD dimension of a cell within another region, such as a first region.

Figure 3:
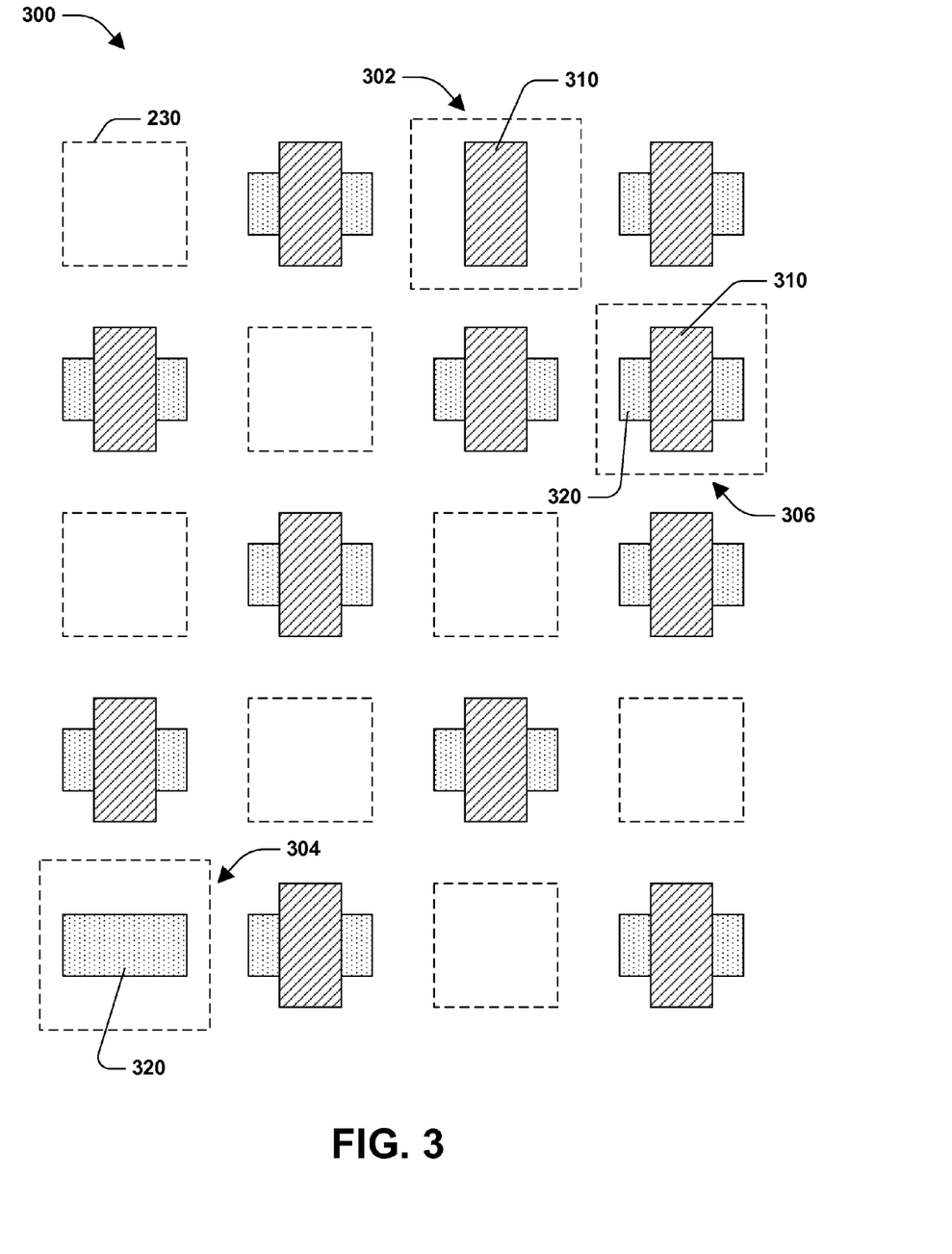
FIG. 3 is a layout view of an example array of cells for mitigating density gradients between regions, according to some embodiments.

FIG. 3 is a layout view 300 of an example array of cells for mitigating density gradients between regions, according to some embodiments. In some embodiments, a first subset of gates 310 is inserted into at least some of the empty cell spaces. In some embodiments, the first subset of gates 310 is associated with the same first gate dimension 212 as the first set of gates 210. In some embodiments, the first set of gates 210 of FIG. 2 comprises the first subset of gates 310. For example, at 302, a gate of the first subset of gates 310 is inserted into an empty cell space, such as the empty cell space of FIG. 2. In some embodiments, a first subset of OD regions 320 is inserted into at least some of the empty cell spaces. In some embodiments, the first subset of OD regions 320 is associated with the same first OD dimension 222 as the first set of OD regions 220. In some embodiments, the first set of OD regions 220 of FIG. 2 comprises the first subset of OD regions 410 of FIG. 4. For example, at 304, an OD region of the first subset of OD regions 320 is inserted into an empty cell space, such as the empty cell space of FIG. 2. Additionally, an entire cell comprising gate 310 and OD region 320 is inserted according to some embodiments, such as at 306, for example. In some embodiments, the gate 310 and OD region 320 of the entire cell are associated with the first subset of gates 310 and the first subset of OD regions 320, for example. In some embodiments, at least one of the first subset of gates 310 or the first subset of OD regions 320 is inserted, at least because the density gradients, such as a difference in at least one of pattern density, gate density, or OD region density, between a first region and the second region associated with the cell array is greater than ten percent. In this way, respective density gradients are adjusted or mitigated, for example. In some embodiments, at least one of the first subset of gates 310 or the first subset of OD regions 320 is inserted based on at least one of a first pattern density, a first OD density, or a first gate density of a first region. In some embodiments, one or more iterations of insertions is performed until respective density gradients are less than a threshold, such as ten percent, for example. For example, when a respective iteration is performed, at least one of a number of gates associated with the first set of gates 210, the first subset of gates 310, or a number of gates associated with the second set of gates 410 inserted is increased. Accordingly, at least one of the number of gates associated with the first set of gates or the number of gates associated with the second set of gates is based on a first gate density of a first region. Similarly, at least one of a number of OD regions associated with the first set of OD regions 220, the first subset of OD regions 320, or a number of OD regions associated with the second set of OD regions 420 of FIG. 4 inserted is based on a first OD density of the first region. Accordingly, at least one of the first subset of gates 310 or the first subset of OD regions 320 is paired with a set of corresponding OD regions or gates, as will be described in FIG. 4.

Figure 4:
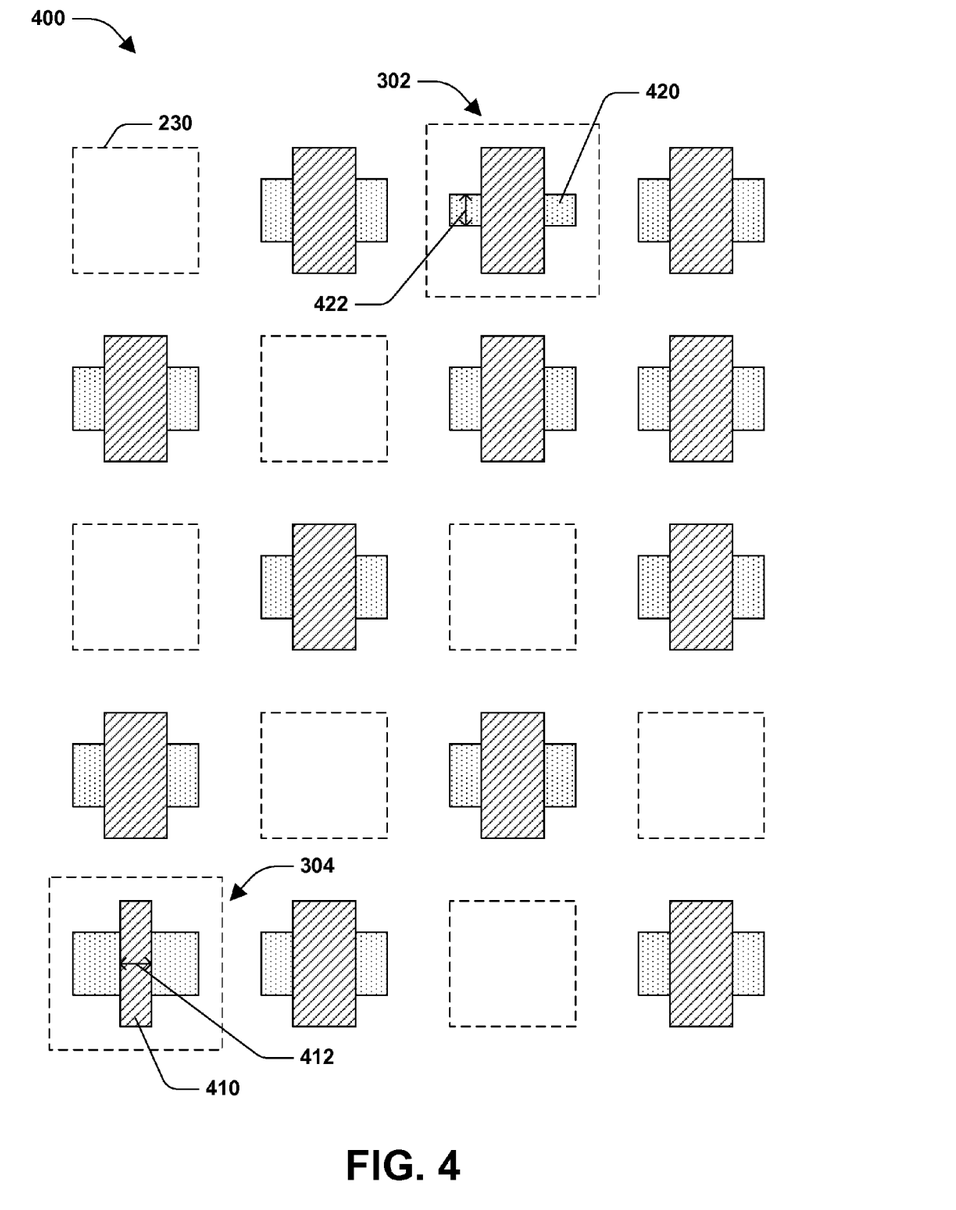
FIG. 4 is a layout view of an example array of cells for mitigating density gradients between regions, according to some embodiments.

FIG. 4 is a layout view 400 of an example array of cells for mitigating density gradients between regions, according to some embodiments. In some embodiments a gate 410 is inserted or paired with a lone OD region. In other words, gates are inserted at remaining cell spaces and OD regions are inserted at remaining cell spaces. For example, a remaining cell space is a OD region not associated with a gate or a gate not associated with an OD region. Accordingly, the OD region at 304 is a lone OD region, at least because it is not associated with a gate. In some embodiments, gate 410 is paired with the OD region from the first subset of OD regions 320. In some embodiments, gate 410 is associated with a second gate dimension 412. Similarly, the gate at 302 is a lone gate, at least because it is not associated with an OD region. In some embodiments, OD region 422 is paired with the gate from the first subset of gates 310. In some embodiments, OD region 420 is associated with a second OD dimension 422. It will be appreciated that at least one of the second OD dimension 422 is different than the first OD dimension 222 of FIG. 2 or the second gate dimension 412 is different than the first gate dimension 212 of FIG. 2. In some embodiments, cells of the array of cells are flexible cells, at least because respective cells are associated with multiple dimensions, such as a first gate dimension 212, a second gate dimension 222, a first OD dimension 412, or a second OD dimension 422. In this way, a single flexible cell facilitates mitigation of density gradients between regions. In some embodiments, a cell is formed such that the cell comprises a gate associated with the first gate dimension 212 and an OD region associated with the second OD dimension 422, such as cell at 302. In some embodiments, a cell is formed such that the cell comprises a gate associated with the second gate dimension 412 and an OD region associated with the first OD dimension 222, such as the cell at 304. Accordingly, at least some of the empty cell spaces, such as space 230 of FIG. 3, are paired with a corresponding OD gate pair, as will be described in FIG. 5.

Figure 5:
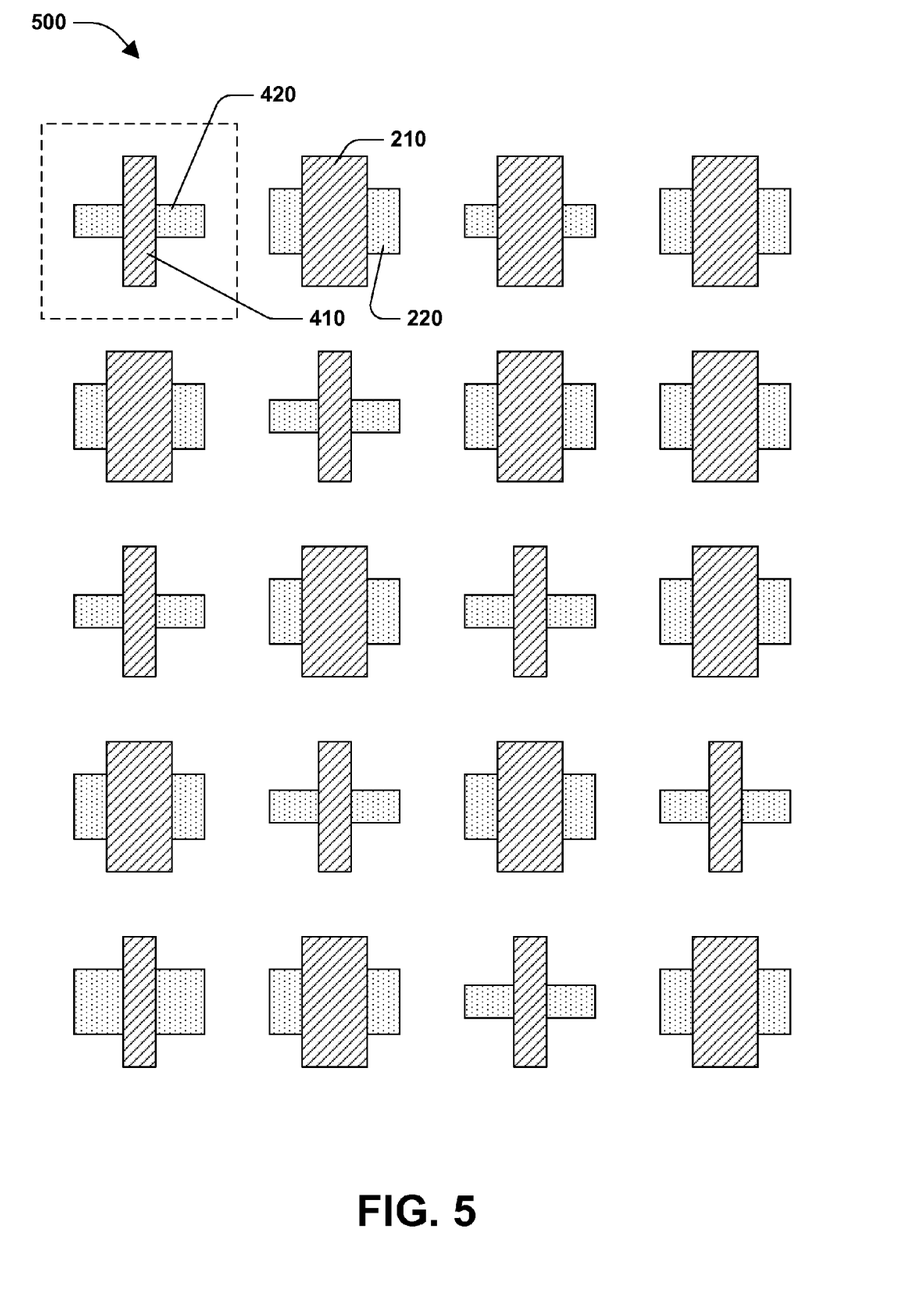
FIG. 5 is a layout view of an example array of cells for mitigating density gradients between regions, according to some embodiments.

FIG. 5 is a layout view 500 of an example array of cells for mitigating density gradients between regions, according to some embodiments. In some embodiments, one or more remaining cell spaces is filled with at least one of a second set of gates 410 associated with a second gate dimension 412 or a second set of OD regions 420 associated with a second OD dimension 422. For example, a remaining cell space is at least one of not associated with a gate, not associated with an OD region, or not associated with a gate and not associated with an OD region. It will be appreciated that the second set of OD regions 420 and the second set of gates 410 impact at least one of the second pattern density, the second gate density, or the second OD density when inserted. In some embodiments, such an impact is accounted for by calculating an adjusted dimension, for example.

In some embodiments, FIG. 5 illustrates an array of cells for mitigating density gradients between regions. For example, the array of cells comprises an array of gates and an array of OD regions. For example, the array of gates comprises a first set of gates 210 associated with a first gate dimension 212 and a second set of gates 410 associated with a second gate dimension 412. Similarly, the array of OD regions comprises a first set of OD regions 220 associated with a first OD dimension 222 and a second set of OD regions 420 associated with a second OD dimension 422.

In some embodiments, the array of cells follows a set of design rules. For example, a design rule pairs an empty cell space with a gate and an OD region. In some embodiments, a lone OD region is paired with a gate. Similarly, a lone gate is paired with an OD region. In some embodiments, a lone OD region or a lone gate is a remaining cell space.

In some embodiments, at least one of a first pattern density, a first gate density, or a first OD density is determined for a first region. In some embodiments, a corresponding dimension for an OD region or a gate is based on a design maximum. In some embodiments, the corresponding dimension is based on an analysis of the first region. For example, at least one of a number of gates associated with the first set of gates, such as at least one of the first set of gates 210 or the first subset of gates 310 of FIG. 3, or a number of gates associated with the second set of gates, such as the second set of gates 410 of FIG. 4 is based on a first gate density of a first region. In some embodiments, at least one of a number of OD regions associated with the first set of OD regions, such as the first set of OD regions 220 of FIG. 2 or the first subset of OD regions 320 of FIG. 3, or a number of OD regions associated with the second set of OD regions, such as the second set of OD regions 420 of FIG. 4, is based on a first OD density of the first region, for example. In this way, at least one of a gate density, OD density, pattern density, etc. is controlled for an array of cells based on the first region, for example. In some embodiments, a number of gates associated with a third set of gates (not shown) is based on the first gate density of the first region. Similarly, a number of OD regions associated with a third set of OD regions (not shown) is based on the first OD density of the first region. In some embodiments, the corresponding dimension is based on an analysis of the second region. For example, the dimension is based on at least one of a count of cells in the second region, a target density for the second region, etc. In some embodiments, at least some of at least one of the first set of gates 210, the first set of OD regions 220, the first subset of gates 310, or the first subset of OD regions 320 is at least one of partially removed or removed. In some embodiments, at least one of the second set of OD regions 420 or the second set of gates 410 is inserted to replace the removed gates or OD regions. In some embodiments, the cell array is configured to be a duplicate of at least some of the cell array of another region. For example, the cell array is configured to duplicate at least one of a main pattern, an active pattern, a surrounding pattern, a dummy pattern, etc. In this way, density gradients are mitigated, for example.

Figure 6:
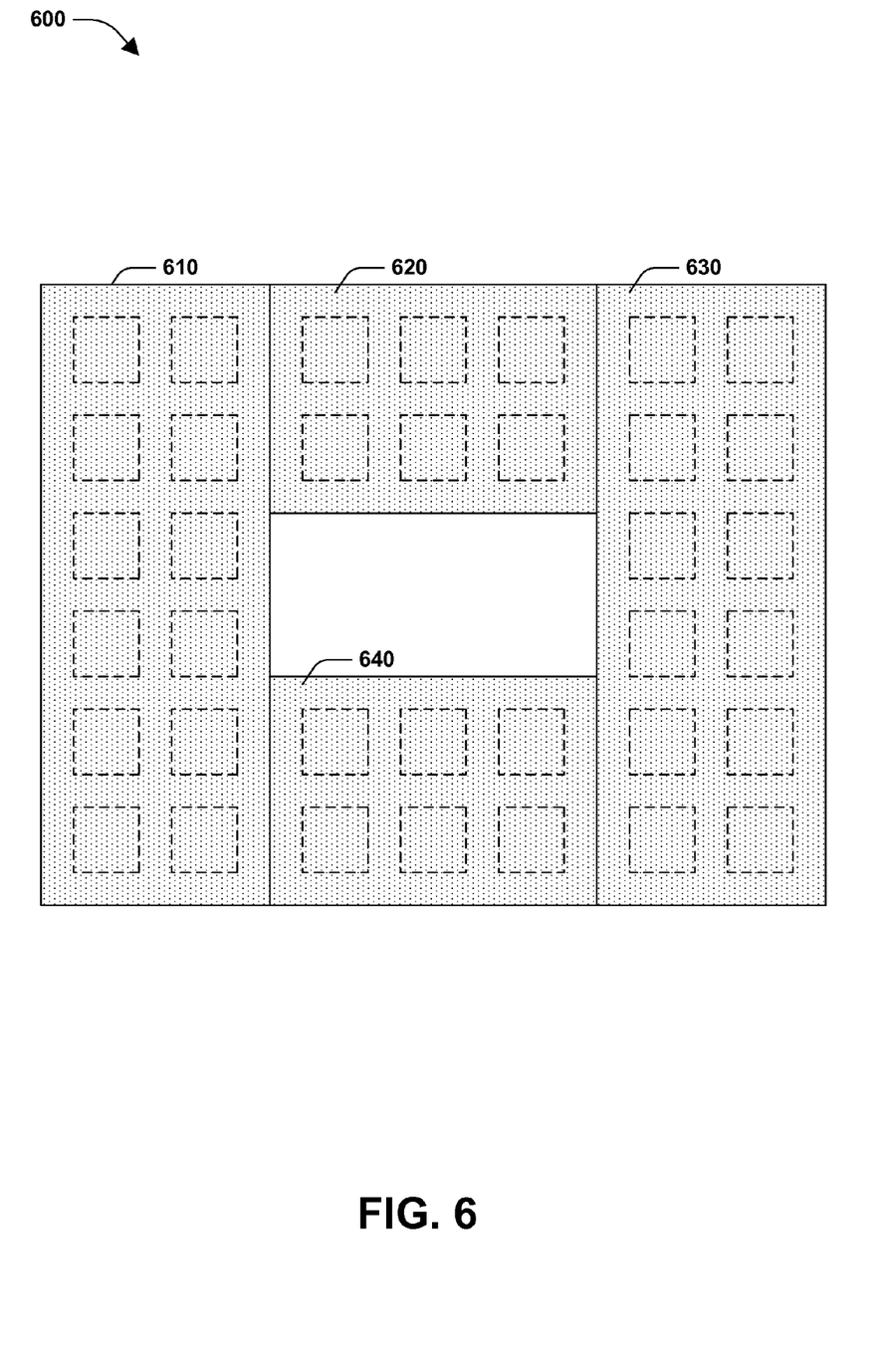
FIG. 6 is a layout view of an example array of cells for mitigating density gradients between regions, according to some embodiments.
Figure 7:
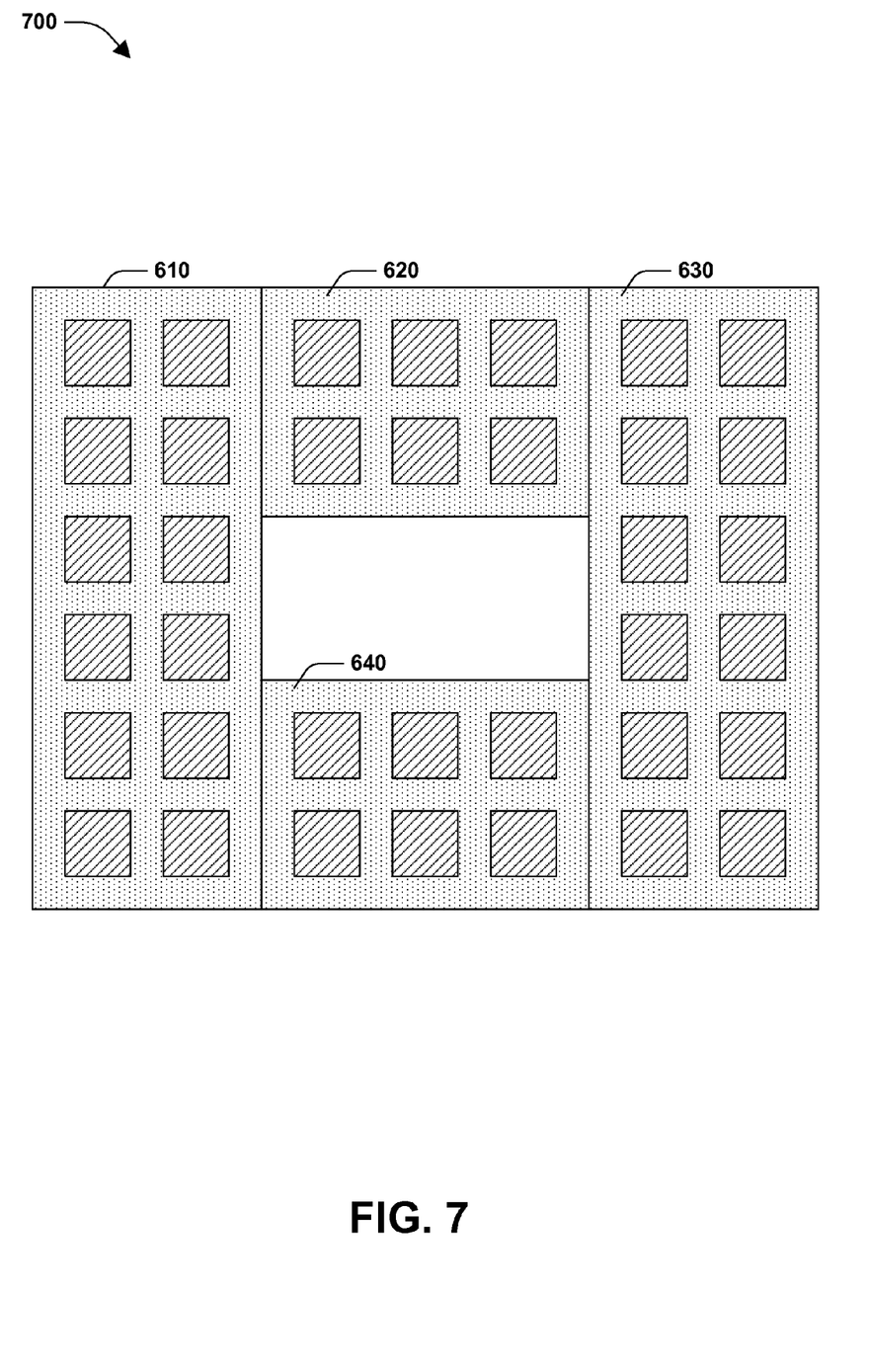
FIG. 7 is a layout view of an example array of cells for mitigating density gradients between regions, according to some embodiments.

FIG. 6 is a layout view 600 of an example array of cells for mitigating density gradients between regions, according to some embodiments. In some embodiments, the array of cells is laid out based on a fill region partition. For example, a first fill region partition 610 is indicated. Similarly, a second, third, and fourth fill region partition 620, 630, and 640 are indicated, respectively. In FIG. 6, cells have not yet been inserted into the fill region partitions 610, 620, 630, and 640. FIG. 7 is a layout view 700 of an example array of cells for mitigating density gradients between regions, according to some embodiments. FIG. 7 is similar to FIG. 6, except that the array of FIG. 7 is filled with cells based on densities of a first region (not shown). In some embodiments, cells are inserted into respective fill region partitions beginning at an initial location for respective fill region partitions. In some embodiments, a first gate dimension is set based on a fill region and a first OD dimension is set based on a fill region.

Figure 8:
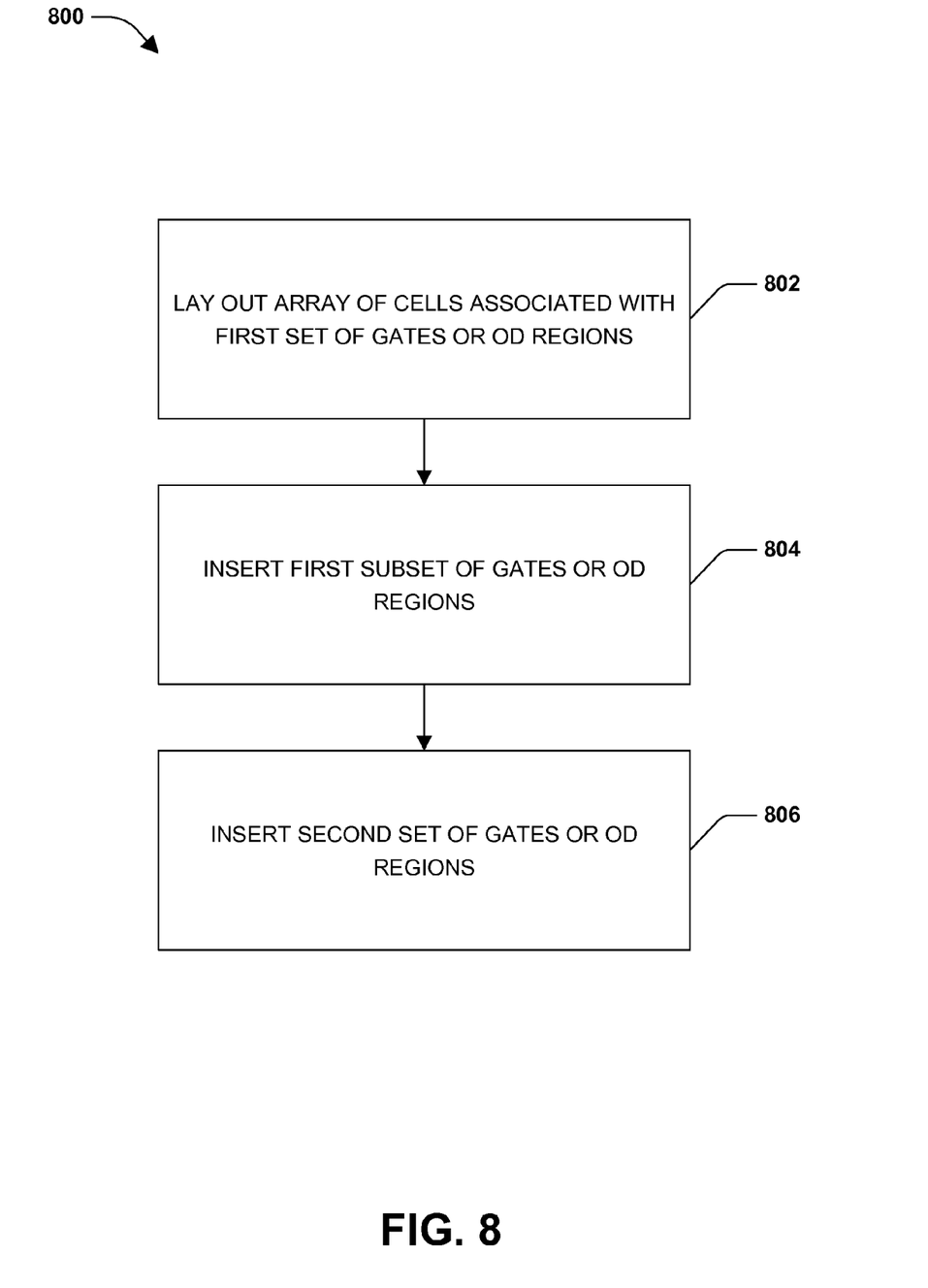
FIG. 8 is a flow diagram of an example method for forming an array of cells for mitigating density gradients between regions, according to some embodiments.

FIG. 8 is a flow diagram of an example method 800 for forming an array of cells for mitigating density gradients between regions, according to some embodiments. In some embodiments, the method 800 comprises laying out an array of cells at 802. For example, the array of cells comprises one or more empty cell spaces, a first set of gates associated with a first gate dimension, and a first set of OD regions associated with a first OD dimension. In some embodiments, the method 800 comprises inserting at least one of a first subset of gates associated with the first gate dimension into at least some of the empty cell spaces or inserting a first subset of OD regions associated with the first OD dimension into at least some of the empty cell spaces at 804. In some embodiments, the method 800 comprises inserting a second set of gates associated with a second gate dimension into at least some remaining cell spaces or inserting a second set of OD regions associated with a second OD dimension into at least some remaining cell spaces at 806.

Figure 9:
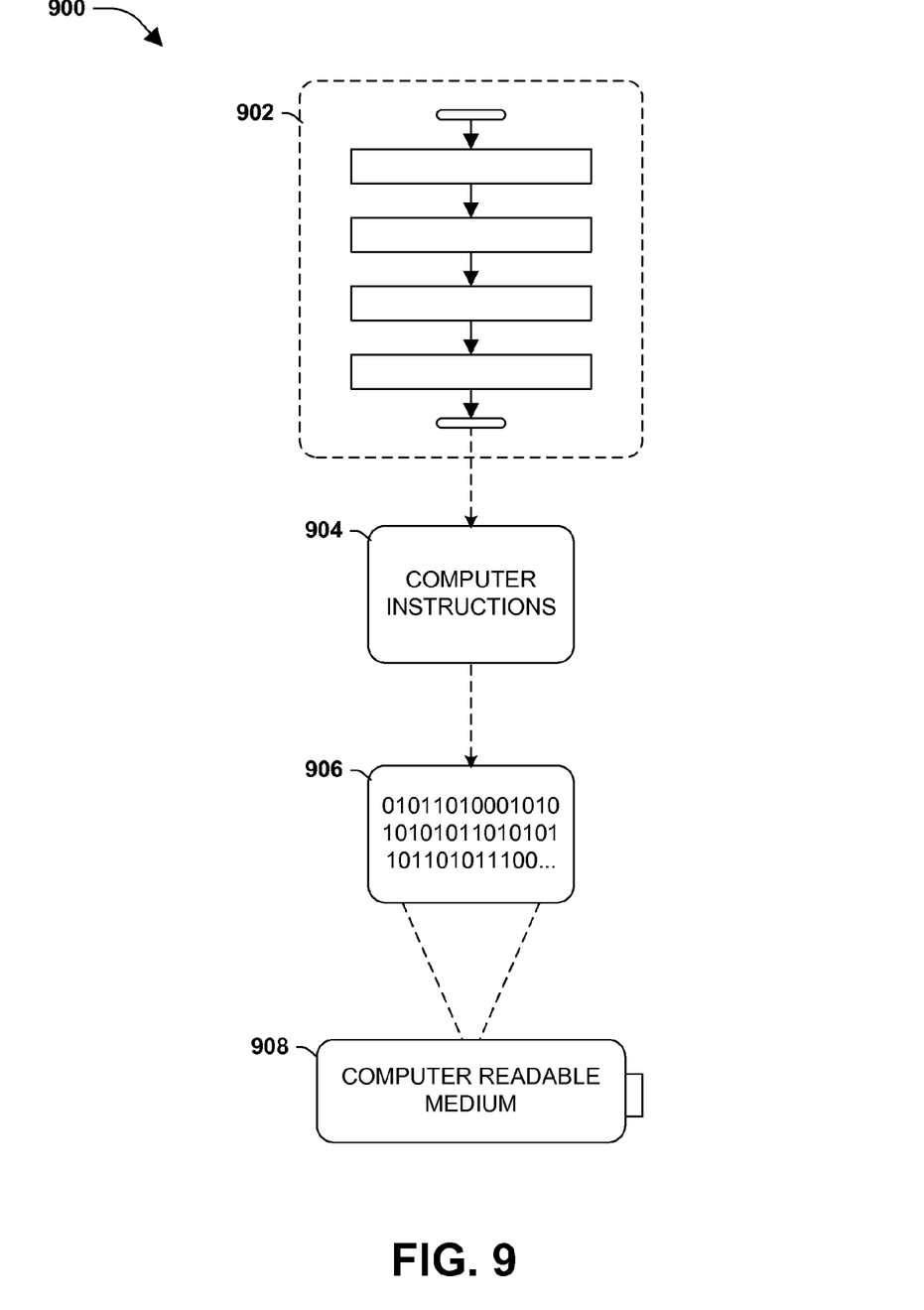
FIG. 9 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 9, wherein an implementation 900 comprises a computer-readable medium 908, such as a CD-R, DVD-R, flash drive, a platter of a hard disk drive, etc., on which is encoded computer-readable data 906. This computer-readable data 906, such as binary data comprising a plurality of zero's and one's as shown in 906, in turn comprises a set of computer instructions 904 configured to operate according to one or more of the principles set forth herein. In one such embodiment 900, the processor-executable computer instructions 904 are configured to perform a method 902, such as at least some of the exemplary method 800 of FIG. 8, for example. In another embodiment, the processor-executable instructions 904 are configured to implement a system, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 10:
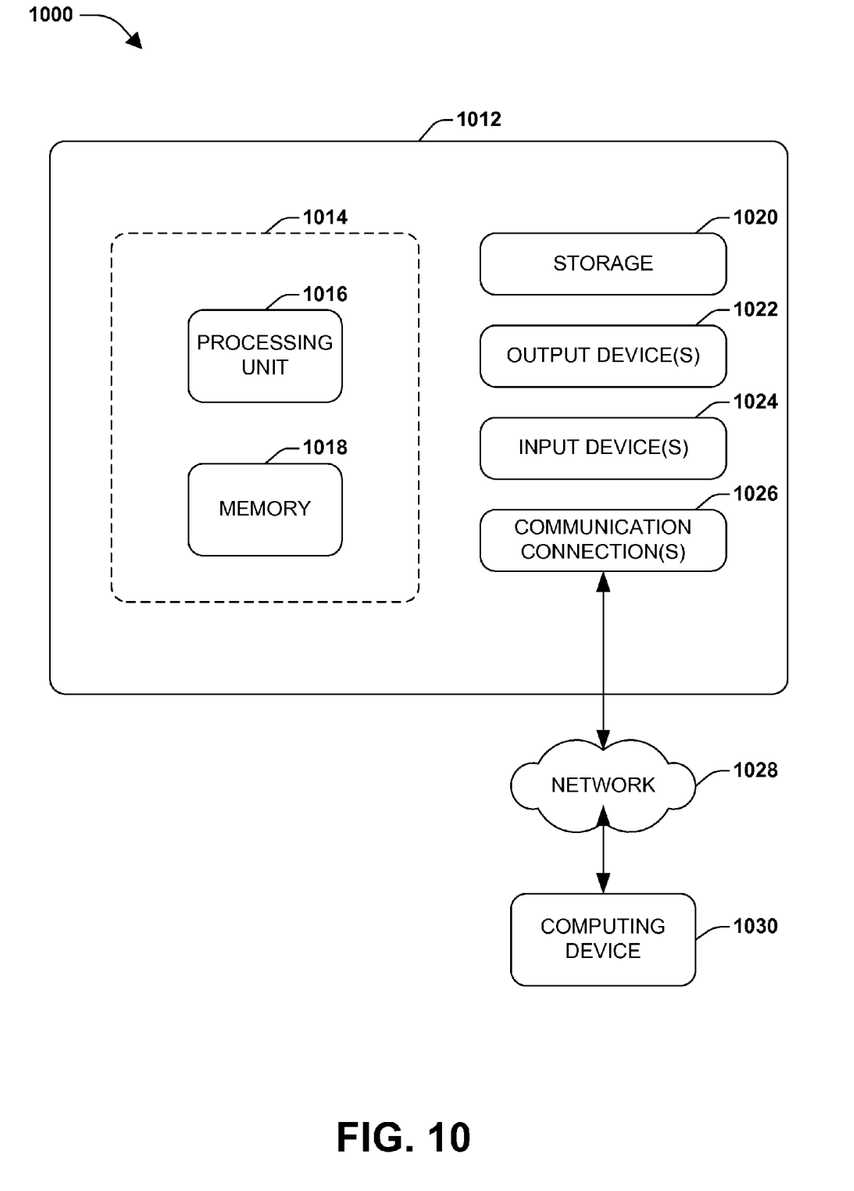
FIG. 10 is an illustration of an example computing environment where one or more of the provisions set forth herein are implemented, according to some embodiments.

FIG. 10 and the following discussion provide a description of a suitable computing environment to implement embodiments of one or more of the provisions set forth herein. The operating environment of FIG. 10 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 10 illustrates an example of a system 1000 comprising a computing device 1012 configured to implement one or more embodiments provided herein. In one configuration, computing device 1012 includes at least one processing unit 1016 and memory 1018. Depending on the exact configuration and type of computing device, memory 1018 may be volatile, such as RAM, non-volatile, such as ROM, flash memory, etc., or some combination of the two. This configuration is illustrated in FIG. 10 by dashed line 1014.

In other embodiments, device 1012 includes additional features or functionality. For example, device 1012 also includes additional storage such as removable storage or non-removable storage, including, but not limited to, magnetic storage, optical storage, and the like. Such additional storage is illustrated in FIG. 10 by storage 1020. In some embodiments, computer readable instructions to implement one or more embodiments provided herein are in storage 1020. Storage 1020 also stores other computer readable instructions to implement an operating system, an application program, and the like. Computer readable instructions are loaded in memory 1018 for execution by processing unit 1016, for example.

The term "computer readable media" as used herein includes computer storage media. Computer storage media includes volatile and nonvolatile, removable and non-removable media implemented in any method or technology for storage of information such as computer readable instructions or other data. Memory 1018 and storage 1020 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1012. Any such computer storage media is part of device 1012.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 1012 includes input device(s) 1024 such as keyboard, mouse, pen, voice input device, touch input device, infrared cameras, video input devices, or any other input device. Output device(s) 1022 such as one or more displays, speakers, printers, or any other output device are also included in device 1012. Input device(s) 1024 and output device(s) 1022 are connected to device 1012 via a wired connection, wireless connection, or any combination thereof. In some embodiments, an input device or an output device from another computing device are used as input device(s) 1024 or output device(s) 1022 for computing device 1012. Device 1012 also includes communication connection(s) 1026 to facilitate communications with one or more other devices.

According to some aspects, an array of cells for mitigating density gradients between regions is provided, comprising an array of gates and an array of OD regions. For example, the array of gates comprises a first set of gates associated with a first gate dimension and a second set of gates associated with a second gate dimension. For example, the array of OD regions comprises a first set of OD regions associated with a first OD dimension and a second set of OD regions associated with a second OD dimension. In some embodiments, at least one of a number of gates associated with the first set of gates or a number of gates associated with the second set of gates is based on a first gate density of a first region. Additionally, at least one of a number of OD regions associated with the first set of OD regions or a number of OD regions associated with the second set of OD regions is based on a first OD density of a first region.

According to some aspects, a method for forming an array of cells for mitigating density gradients between regions is provided, comprising laying out an array of cells. For example, the array of cells comprises one or more empty cell spaces, a first set of gates associated with a first gate dimension, and a first set of OD regions associated with a first OD dimension. In some embodiments, the method comprises inserting a first subset of gates associated with the first gate dimension into at least some of the empty cell spaces. In some embodiments, the method comprises inserting a first subset of OD regions associated with the first OD dimension into at least some of the empty cell spaces. In some embodiments, the method comprises inserting a second set of gates associated with a second gate dimension into at least some remaining cell spaces. In some embodiments, the method comprises inserting a second set of OD regions associated with a second OD dimension into at least some remaining cell spaces.

According to some aspects, an array of cells for mitigating density gradients between regions is provided, comprising an array of gates and an array of OD regions. In some embodiments, the array of gates comprises a first set of gates associated with a first gate dimension, a second set of gates associated with a second gate dimension, and a third set of gates associated with a third gate dimension. In some embodiments, the array of OD regions comprises a first set of OD regions associated with a first OD dimension, a second set of OD regions associated with a second OD dimension, and a third set of OD regions associated with a third OD dimension. In some embodiments, at least one of a number of gates associated with the first set of gates, a number of gates associated with the second set of gates, or a number of gates associated with the third set of gates is based on a first gate density of a first region. Additionally, at least one of a number of OD regions associated with the first set of OD regions, a number of OD regions associated with the second set of OD regions, or a number of OD regions associated with the third set of OD regions is based on a first OD density of a first region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first region, second region, dummy region(s), OD region, gate, gate region, identical dummy, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method for forming an array of dummy cells for mitigating density gradients between an active region comprising a plurality of active cells and a dummy region adjacent the active region and comprising a plurality of dummy cells, the method comprising:
   laying out the array of dummy cells, the array of dummy cells comprising:
      a plurality of empty cell spaces; and
      a first set of dummy cells, comprising:
         a first set of gates having a first gate dimension; and
         a first set of oxide defined (OD) regions having a first OD dimension;
   inserting at least one of:
      a first subset of gates having the first gate dimension into at least some of the plurality of empty cell spaces; or
      a first subset of OD regions having the first OD dimension into at least some of the plurality of empty cell spaces; and
   inserting at least one of:

a second set of gates having a second gate dimension into at least some remaining empty cell spaces of the plurality of empty cell spaces; or a second set of OD regions having a second OD dimension into at least some remaining empty cell spaces of the plurality of empty cell spaces.

2. The method of claim 1, comprising:
setting the first gate dimension to a design maximum gate dimension; and
setting the first OD dimension to a design maximum OD dimension.

3. The method of claim 1, comprising:
setting the first gate dimension to a gate dimension of an active cell within the active region; and
setting the first OD dimension to an OD dimension of an active cell within the active region.

4. The method of claim 1, comprising:
setting the first gate dimension based on a gate dimension of an active cell within the active region; and
setting the first OD dimension based on an OD dimension of an active cell within the active region.

5. The method of claim 1, comprising removing at least some of at least one of:
the first set of gates; or
the first set of OD regions.

6. The method of claim 1, comprising laying out the array of dummy cells based on a checkerboard pattern.

7. The method of claim 1, comprising inserting at least one of the first subset of gates or the first subset of OD regions based on at least one of a first pattern density, a first OD density, or a first gate density of the active region.

8. The method of claim 1, comprising laying out the array of dummy cells based on a fill region partition.

9. The method of claim 8, comprising laying out the array of dummy cells within the fill region partition at an initial location.

10. The method of claim 1, comprising:
setting the first gate dimension based on a fill region; and
setting the first OD dimension based on a fill region.

11. The method of claim 1, comprising adjusting a second pattern density for the array of dummy cells based on a first pattern density of the active region.

12. The method of claim 1, comprising adjusting a second gate density for the array of dummy cells based on a first gate density of the active region.

13. The method of claim 1, comprising adjusting a second OD density for the array of dummy cells based on a first OD density of the active region.

14. The method of claim 1, comprising forming a dummy cell comprising a gate having with the first gate dimension and an OD region having the second OD dimension.

15. The method of claim 1, comprising forming a dummy cell comprising a gate having the second gate dimension and an OD region having the first OD dimension.

16. A method for forming an array of dummy cells for mitigating density gradients between an active region comprising a plurality of active cells and a dummy region adjacent the active region and comprising a plurality of dummy cells, the method comprising:
laying out the array of dummy cells, the array of dummy cells comprising:
a plurality of empty cell spaces; and
a first set of dummy cells, comprising:
a first set of gates having a first gate dimension; and
a first set of oxide defined (OD) regions having a first OD dimension; and
inserting into a first set of the plurality of empty cell spaces:
a second set of dummy cells comprising:
a second set of gates having the first gate dimension; and
a second set of OD regions having a second OD dimension; or
a third set of dummy cells comprising:
a third set of gates having a second gate dimension; and
a third set of OD regions having the first OD dimension.

17. The method of claim 16, comprising:
inserting into a second set of the plurality of empty cell spaces a fourth set of dummy cells comprising:
a fourth set of gates having the second gate dimension; and
a fourth set of OD regions having the second OD dimension.

18. The method of claim 16, at least one of:
the second gate dimension less than the first gate dimension; or
the second OD dimension less than the first OD dimension.

19. The method of claim 16, the plurality of empty cell spaces and the first set of dummy cells arranged in a checkerboard pattern.

20. A method for forming an array of dummy cells for mitigating density gradients between an active region comprising a plurality of active cells and a dummy region adjacent the active region and comprising a plurality of dummy cells, the method comprising:
laying out the array of dummy cells, the array of dummy cells comprising:
a plurality of empty cell spaces; and
a first set of dummy cells, comprising:
a first set of gates having a first gate dimension; and
a first set of oxide defined (OD) regions having a first OD dimension;
inserting into a first set of the plurality of empty cell spaces:
a second set of dummy cells comprising:
a second set of gates having the first gate dimension; and
a second set of OD regions having a second OD dimension; or
a third set of dummy cells comprising:
a third set of gates having a second gate dimension; and
a third set of OD regions having the first OD dimension; and
inserting into a second set of the plurality of empty cell spaces a fourth set of dummy cells comprising:
a fourth set of gates having the second gate dimension; and
a fourth set of OD regions having the second OD dimension, the second gate dimension less than the first gate dimension and the second OD dimension less than the first OD dimension.

* * * * *